United States Patent
Chuang

(10) Patent No.: US 8,379,387 B2
(45) Date of Patent: Feb. 19, 2013

(54) FAN FIXING APPARATUS

(75) Inventor: Hsien-Cheng Chuang, Taipei (TW)

(73) Assignee: Inventec Corporation, Taipei (TW)

( * ) Notice: Subject to any disclaimer, the term of this patent is extended or adjusted under 35 U.S.C. 154(b) by 309 days.

(21) Appl. No.: 12/980,025

(22) Filed: Dec. 28, 2010

(65) Prior Publication Data

US 2012/0113591 A1    May 10, 2012

(30) Foreign Application Priority Data

Nov. 9, 2010    (TW) ................. 99138555 A

(51) Int. Cl.
*H05K 7/20* (2006.01)
*F01D 25/26* (2006.01)

(52) U.S. Cl. ...... 361/695; 361/690; 361/694; 415/213.1

(58) Field of Classification Search ............ None
See application file for complete search history.

(56) References Cited

U.S. PATENT DOCUMENTS

| | | | |
|---|---|---|---|
| 6,244,953 B1 | 6/2001 | Dugan et al. | |
| 6,556,437 B1 * | 4/2003 | Hardin | 361/679.48 |
| 7,245,490 B2 | 7/2007 | Chou et al. | |
| 7,511,955 B2 * | 3/2009 | Yin | 361/695 |
| 7,522,415 B2 * | 4/2009 | Fan et al. | 361/695 |
| 7,688,585 B2 * | 3/2010 | Yin | 361/695 |
| 7,697,287 B2 * | 4/2010 | Yin | 361/695 |
| 7,771,165 B2 * | 8/2010 | Chen | 415/213.1 |
| 7,845,903 B2 * | 12/2010 | Li | 415/186 |
| 8,246,301 B2 * | 8/2012 | Li | 415/213.1 |

FOREIGN PATENT DOCUMENTS

TW    285896 Y    1/2006

* cited by examiner

*Primary Examiner* — Boris Chervinsky
(74) *Attorney, Agent, or Firm* — Morris Manning & Martin LLP; Tim Tingkang Xia, Esq.

(57) ABSTRACT

An apparatus for fixing a fan on a specific surface is disclosed, which comprises: a bracket, formed with a hollow section; a plurality of side panels, disposed on the specific surface as an array while enabling each side panel to be disposed perpendicular to the specific surface and the bracket; a first clamping piece; and a second clamping piece. The fan is sandwiched between any two neighboring side panels while enabling an end of the fan module where the first clamping piece is mounted to face toward the hollow section. The first clamping piece is configured with a spring that is capable of moving relatively to the fan so as to enable a first protrusion formed on the spring to inset into the hollow section when the spring is moved to a first position, and detach from the hollow section when the spring is move to a second position.

10 Claims, 8 Drawing Sheets

FAN FIXING APPARATUS

CROSS-REFERENCE TO RELATED APPLICATIONS

This non-provisional application claims priority under 35 U.S.C. §119(a) on Patent Application No(s). 099138555 filed in Taiwan, R.O.C. on Nov. 9, 2010, the entire contents of which are hereby incorporated by reference.

FIELD OF THE INVENTION

The present invention relates to a fan fixing apparatus, and more particularly, to a low-cost fan fixing apparatus with simple structure and high space utilization that is adapted for facilitating a fan module to be plugged-in or removed rapidly.

BACKGROUND OF THE INVENTION

Along with the ever-increasing performance enhancement in electronic devices such as servers or computer mainframes, the demand for better heat-dissipation devices is increasing since a good heat-dissipating device can prevent the operation efficiency or even components of an electronic device from being damaged by the heat emitted during operation. Conventionally, the heat dissipation for servers can be enhanced by the installation of multiple heat-dissipating fans as an array in the vicinity of those heat-emitting components in the servers. Generally, since each of those plural heat-dissipating fans is fixed by the use of a baffle structure composed of a front panel, a rear panel and two brackets, the aforesaid conventional fan fixing method not only is disadvantageous in that: the baffle structures for the whole array of the heat-dissipating fans can occupy a huge space, but also is not favored for its high cost in molding the baffle structures as well as the different materials required for building the baffle structure.

There are already many fan fixing apparatuses that are currently available on the market. One of which is a fan fixing apparatus, disclosed in U.S. Pat. No. 7,2485,490, entitled "Screw-free fan bracket mounting structure", in that the screw-free fan bracket mounting structure includes a base frame mounted inside the case of a computer and a fan bracket fastened to the base frame for holding a cooling fan, wherein, the fan bracket is configured with a top protruding block, a retaining block and a bottom hook, and the base frame is configured with an upper coupling hole, a retaining hole and a lower coupling hole for receiving the top protruding block, retaining block and bottom hook of the fan bracket respectively so as to enable the distance between the retaining block and bottom hook of the fan bracket to be slightly greater than the distance between the retaining hole and lower coupling hole of the base frame, and thus enabling the fan bracket to be slightly compressed to produce an amount of plastic deformation and secured firmly to the base frame with an elastic force during installation. However, there is neither a clear description, that is stated in the foregoing U.S. patent, relating to how to mount the cooling fan on the screw-free fan bracket mounting structure, nor a description relating to the status of a cooling fan while being mounted on the mounting structure. That is because the object of the aforesaid U.S. patent is to provide a fan bracket mounting structure, which can be easily and rapidly detached and assembled without the use of screws. However, since the fan bracket fastened to a side of the base frame as it is hanging on a wall, the degree stability and support that it can provided to the cooling fan is doubtful. Moreover, since the fan bracket is fasten to the base frame only by the elastic force resulting from the plastic deformation of the fan bracket, such elastic force may become weakening after a period of time due to elastic fatigue so that the fan bracket may not be able to be fixedly secured to the base frame.

Another such fan fixing apparatus, being disclosed in U.S. Pat. No. 6,244,953, is an electronic device fan mounting system, which includes a L-shaped bracket composed of: a front panel, having two wing sheets respectively mounted to the two side thereof; and a bottom panel, being bended symmetrically at two sides thereof for forming two corners. Consequently, a fan unit receiving space can be defined by the enclosure of the front panel, the two wing sheets, the bottom panel and the two corners so as to be used for holding a fan unit. Moreover, each of the wing sheets is fitted with a retention element to be used for interlocking with a corresponding hook formed on a side panel of a housing. The object of the aforesaid U.S. patent is also to provide a fan mounting system for facilitating a fan module to be plugged-in or removed rapidly. Nevertheless, since it is configured with two wing sheets that are protruding outwardly from the two sides of its front panel at positions corresponding to the hooks on the housing, such configuration may require comparatively larger space to install, not to mention that it is impossible to arrange two fan units closely adjacent to each other, i.e. there must be a gap formed between any two neighboring fan units, Thus, there must be a portion of the space inside the housing that is provided for fan units to mount is wasted.

In addition, as disclosed in TW Pat. No. M285896, the fan mounting apparatus comprises: a bracket, fixed to a base; and a fixing element, for fixedly securing a fan to the bracket. The bracket is configured with two side panels, each having a retaining hole formed at a end thereof, whist the fixing element is configured with two elastic fixtures, each having a protrusion formed at a position corresponding to the retaining hole of its corresponding side panel. It is noted that the two elastic fixtures are designed to fix to the top of a fan unit while allowing the two protrusions to inset into the retaining holes of their corresponding side panels. In addition, it is required to have a bottom panel to connected respectively to the two side panels so as to define a fan receiving frame with three surfaces, since without it, the two side panels are certain to swing uncontrollably, causing the fan to slide easily out of the space sandwiched between the two. Thus, the bottom panel is substantially a separated rear baffle. Nevertheless, when it is required to replace a fan unit, it can be a time consuming and wasteful process since the whole assembly of the two side panels and the bottom panel is required to be detached and replaced as a set.

SUMMARY OF THE INVENTION

In view of the disadvantages of prior art, the primary object of the present invention is to provide a low-cost fan fixing apparatus with simple structure and high space utilization that is adapted for facilitating a fan module to be plugged-in or removed rapidly.

To achieve the above object, the present invention provides a fan fixing apparatus, adapted for mounting a fan formed with a first end and a second that are opposite to each other on a specific surface, which comprises:

a bracket, perpendicularly disposed on the specific surface, formed with at least one hollow section at position allowing the same to the first end of the fan while the first end of the fan is positioned facing toward the bracket;

a plurality of side panels, perpendicularly disposed on the specific surface as an array, while enabling each side panel to be disposed perpendicular to the bracket as one side of each side panel is connected to the bracket for allowing the fan to be received between any two neighboring side panels;

a first clamping piece, arranged at the first end of the fan, configured with a spring while enabling the same to move reciprocatingly between a first position and a second position by the resilience thereof; and a second clamping piece arranged at the second end of the fan;

wherein, the spring is formed with at least one first protrusion, each being formed protruding out of the spring toward the bracket for allowing the same to inset into the corresponding hollow section of the bracket when the spring is moved and positioned at the first position, and detach from the engagement with corresponding hollow section when the spring is moved and positioned at a second position.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
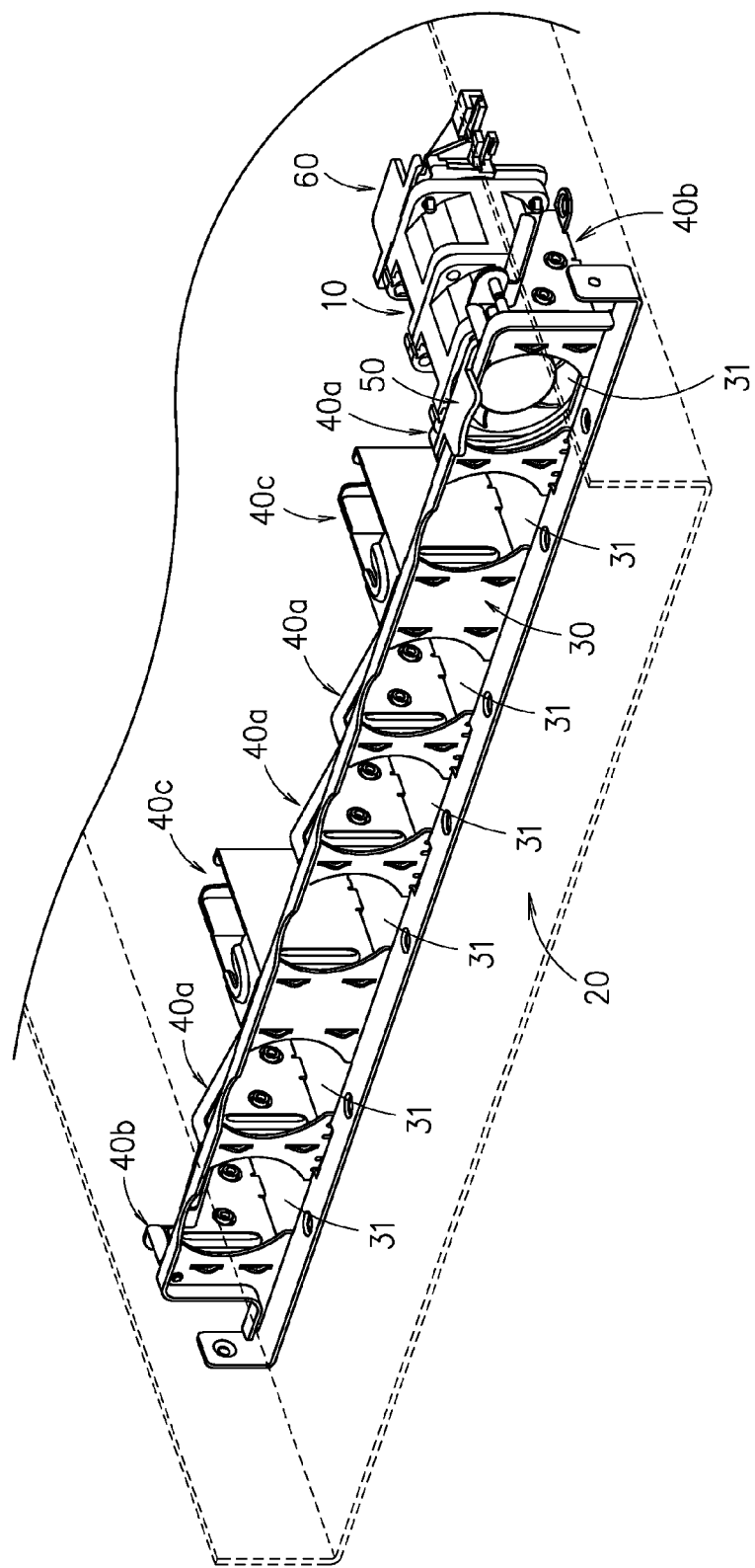
FIG. 1 is a schematic diagram showing a fan fixing apparatus of the present invention.
Figure 2:
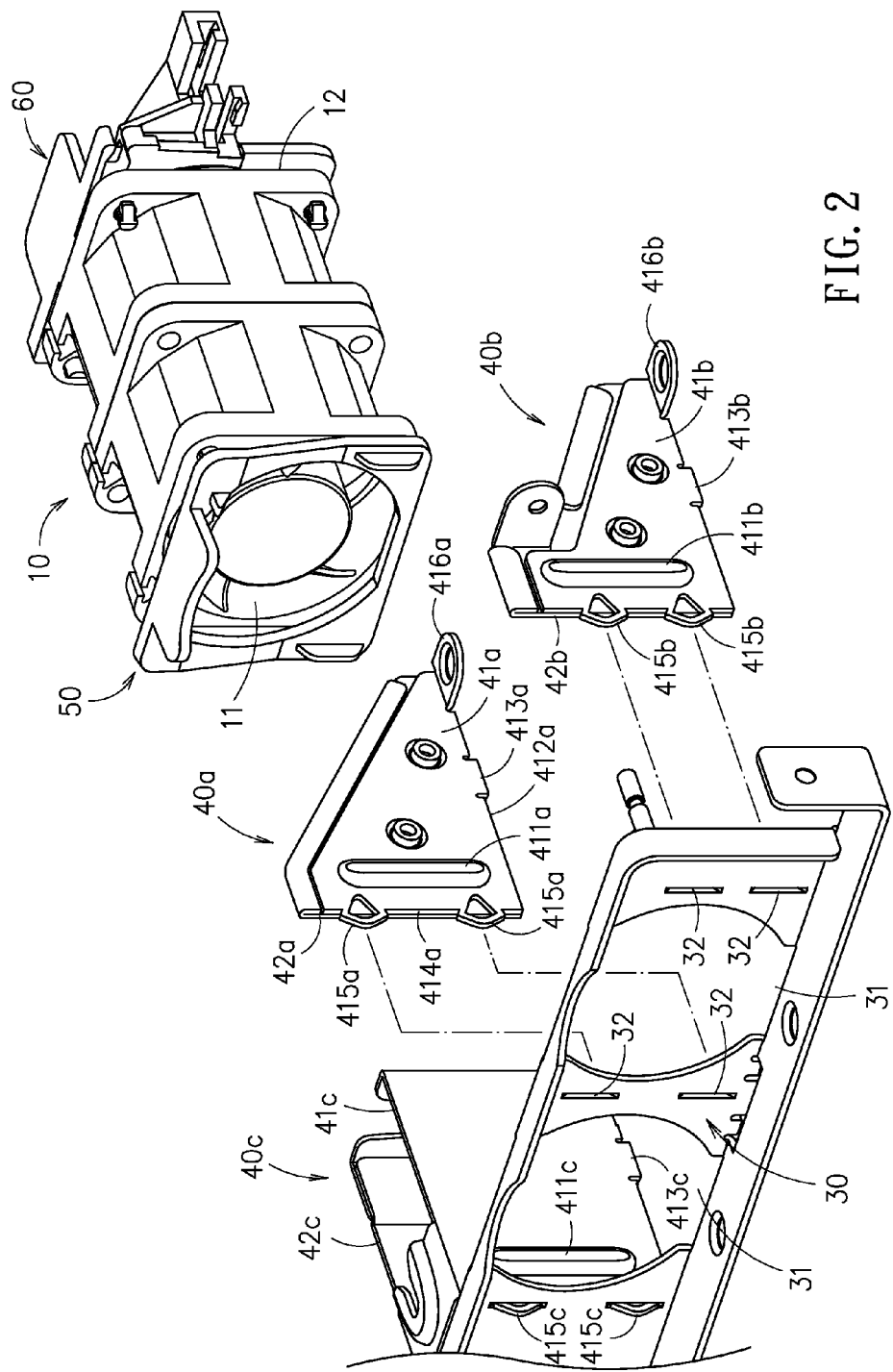
FIG. 2 is an exploded view of a fan fixing apparatus according to the present invention.
Figure 4:
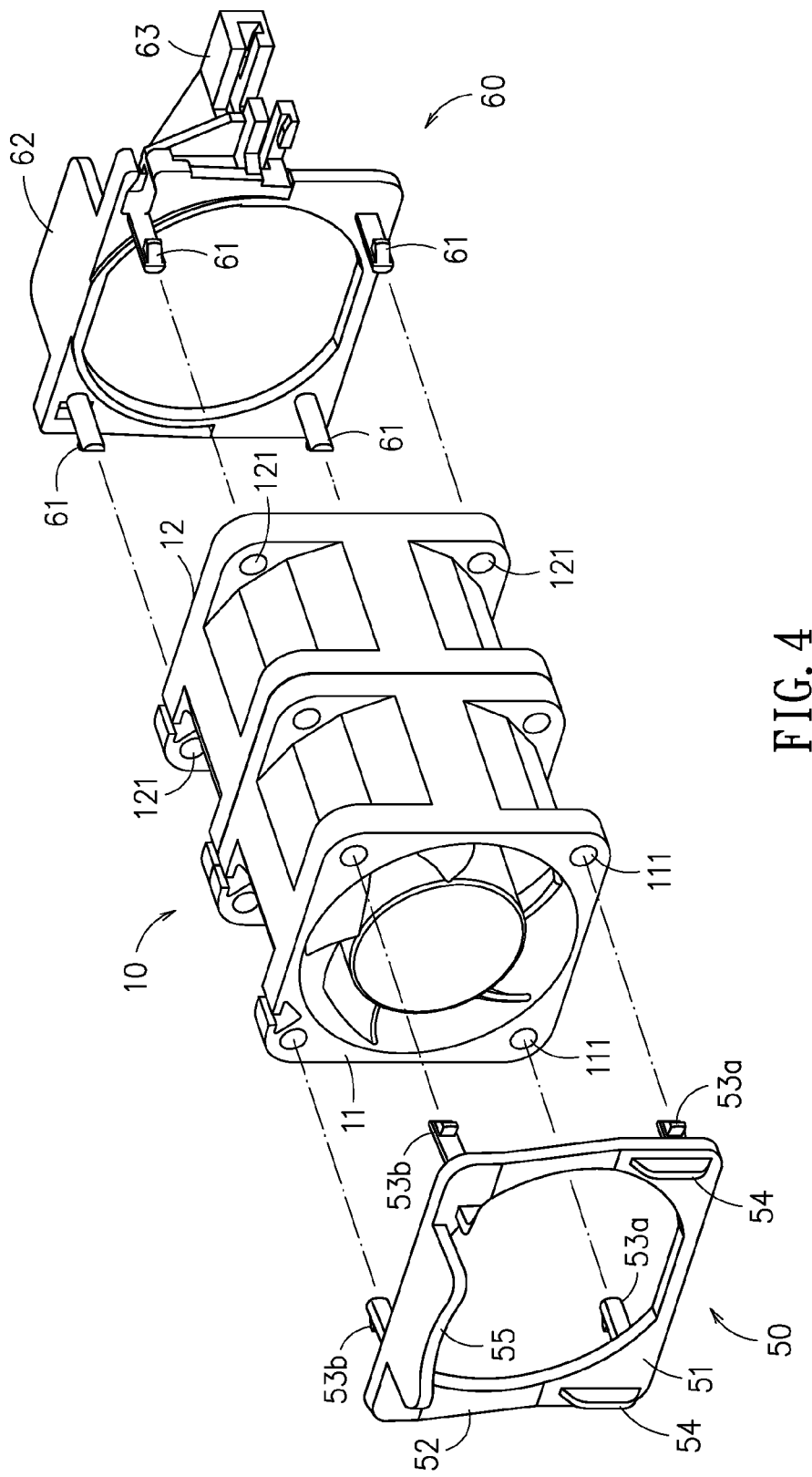
FIG. 4 is an exploded diagram showing a fan module being constructed in the present invention.

Please refer to FIG. 1, FIG. 2 and FIG. 4, which are a schematic diagram and an exploded diagram showing a fan fixing apparatus of the present invention, and an exploded diagram showing a fan module being constructed in the present invention. As shown in the figures, the fan fixing apparatus is comprised of: a bracket 30, a plurality of side panels, 40a, 40b, 40c, a first clamping piece 50 and a second clamping piece 60, in which the bracket 30 and the side panels 40a, 40b, 40c are all disposed on a specific surface 20, whereas the specific surface can be a casing of an electronic device, such as a hard disk drive or a server. The first clamping piece 50 and the second clamping piece are arranged respectively at two opposite ends of a fan 10 so as to establish a fan module, and the so-established fan module can be received inside a frame formed by the enclosure of the bracket 30 and the side panels 40a, 40b, 40c. As the fan 10 is configured with a first end 11 and a second end 12, the first end 11 is used as the outflow end of the fan 10 while the second end 12 is used as the inflow end. Generally, the first end 11 is orientated toward the outside of the electronic device's casing, i.e. facing away from the specific surface 20, and the second end 12 of the fan 10 is orientated facing toward the internal of the casing. Thereby, hot air along with the heat accumulated inside the casing can be drawn to flow into the fan 10 from the second end 12 and then being dissipated out through the first end 11. In another embodiment, opposite to the aforesaid configuration, the first end 11 is orientated toward the internal of the electronic device's casing, and the second end 12 of the fan 10 is orientated facing toward the outside of the casing, by that fresh cooling air can be blown into the casing through the first end 11.

Figure 3:
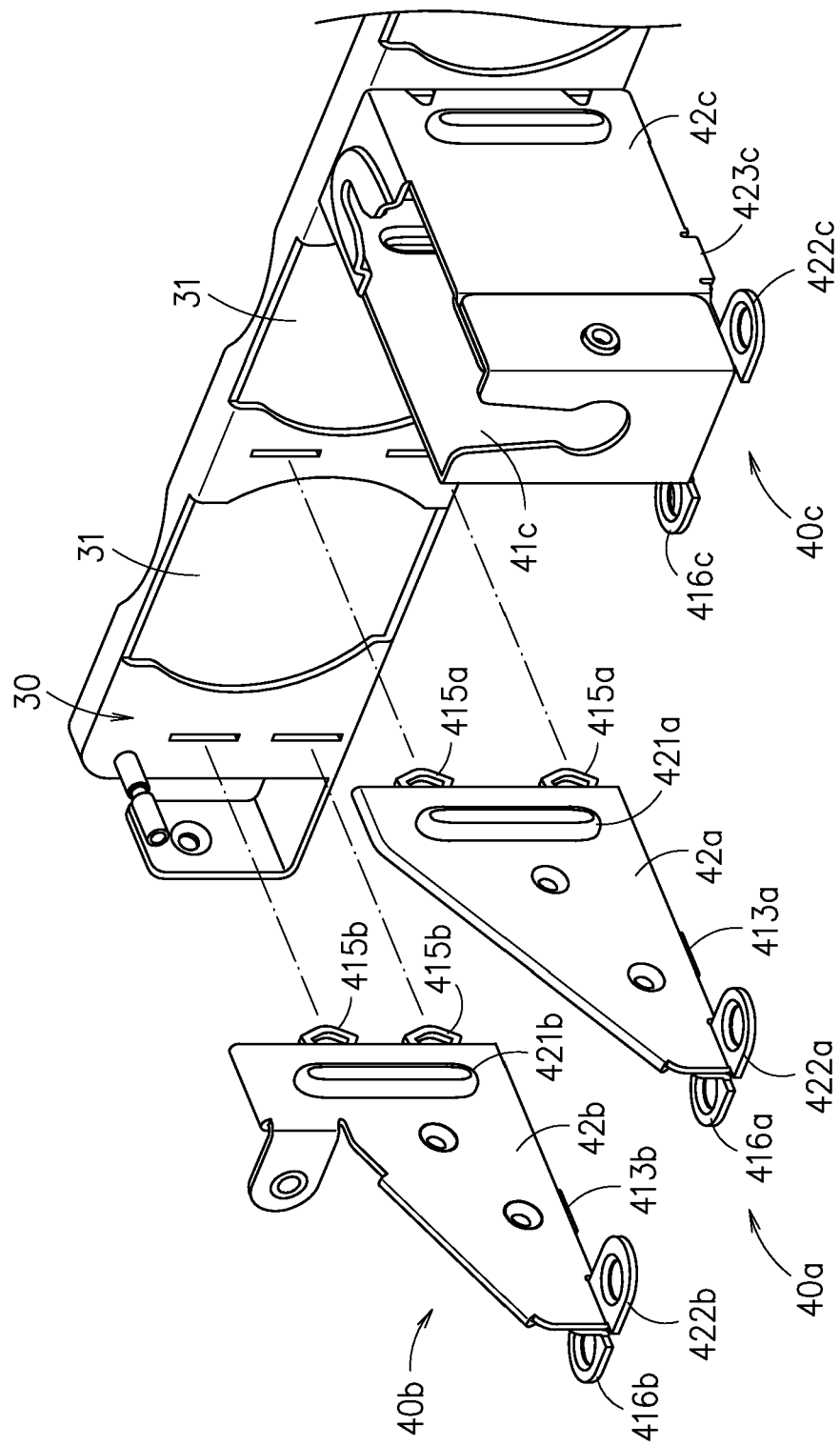
FIG. 3 is an exploded diagram showing a bracket and side panels used in the present invention that is view from a viewing angle different from that of FIG. 2.
Figure 8:
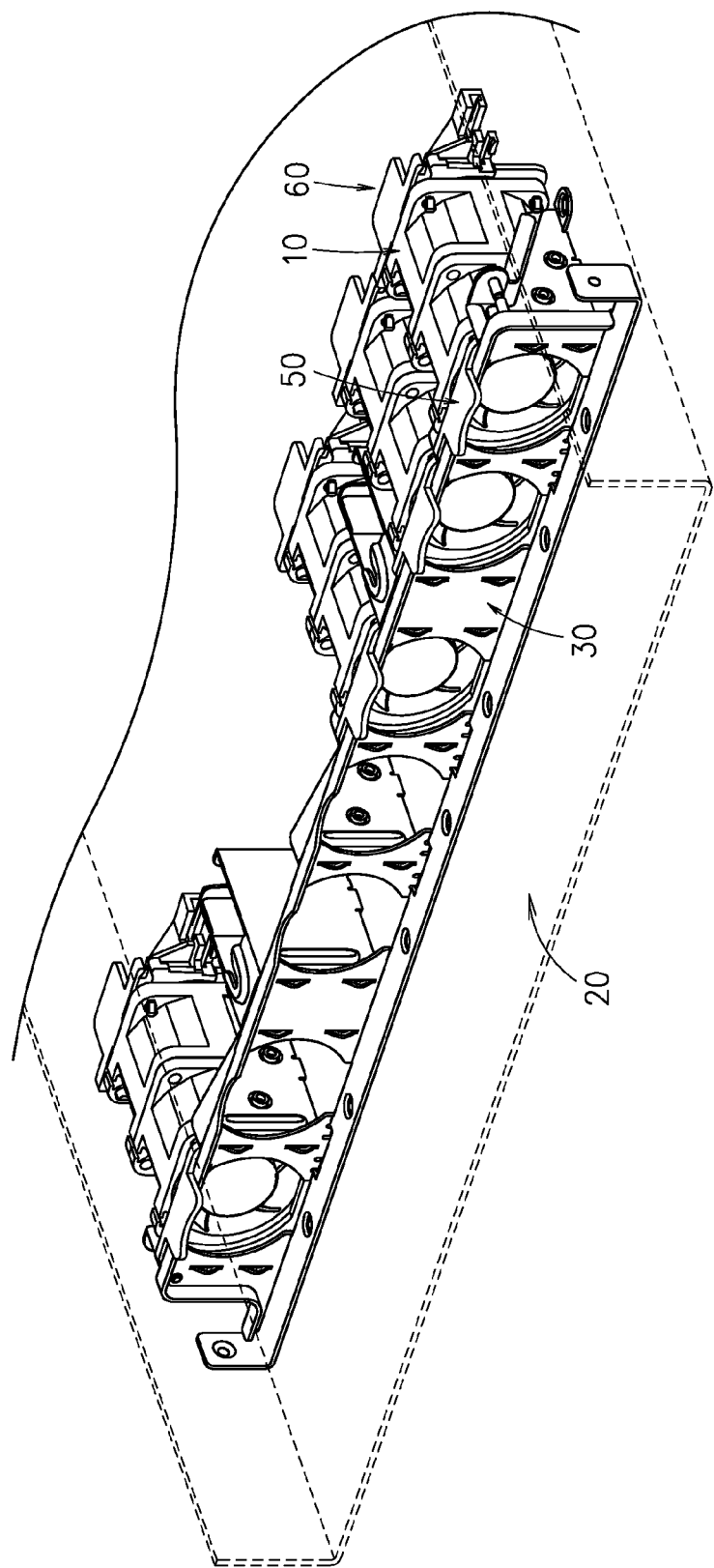
FIG. 8 is a schematic diagram showing a fan fixing apparatus having a plurality of fans mounted thereto.

As shown in FIG. 1 to FIG. 3, the bracket that is perpendicularly mounted on the specific surface 20 is formed with a plurality of hollow sections 31, whereas each hollow section 31 is provided for one fan 10 to be disposed correspondingly thereat, as those shown in FIG. 8. In FIG. 1, only one fan 10 is mounted on the bracket 30 at one selected hollow section 31 so as to be used for illustration. In addition, the plural side panels 40a, 40b, 40c are disposed on the specific surface 20 as an array while enabling each of the plural side panels 40a, 40b, 40c to be disposed perpendicular to the specific surface 20 and the bracket 30. In this embodiment, each of the side panels 40a is composed a first plate 41a and a second plate 42a, both having one second protrusion 411a, 421a formed respectively on surfaces thereof while enabling each of the second protrusions 411a, 421a to extend in a direction perpendicular to the specific surface 20, and simultaneously allowing the surfaces thereof where there is no second protrusion 411a, 421a to be orientated facing toward each other. Similarly, each of the side panels 40b is composed a first plate 41b and a second plate 42b, both having one second protrusion 411b, 421b formed respectively on surfaces thereof while enabling each of the second protrusions 411b, 421b to extend in a direction perpendicular to the specific surface 20, and also each of the side panels 40c is composed a first plate 41c and a second plate 42c, both having one second protrusion 411c, 421c formed respectively on surfaces thereof while enabling each of the second protrusions 411c, 421c to extend in a direction perpendicular to the specific surface 20. It is noted that although there are three types of side panels 40a, 40b, 40c, they are all constructed similarly as a panel composed of two plates, each having a bar-like protrusion forming thereon. The aforesaid three types of side panels are used for illustrating that such variations are not to be regarded as a departure from the spirit and scope of the invention, and all such modifications as would be obvious to one skilled in the art are intended to be included within the scope of the following claims. Among the three types of side panels 40a, 40b, 40c, the type of side panels 40a is selected in the following description for illustrating how each such side panel 40a is connected to the bracket 30 and the specific surface 20. As shown in FIG. 2, the side panel 40a is orientated for enabling a side 412a of its first plate 41a, that is configured with a flange 413a, to engage with the specific surface 20 while allowing the flange 413a to inset into a corresponding slot formed on the specific surface 20, so that the side panel 40a is connected to the specific surface 20. Simultaneously, the side panel 40a is orientated for enabling another side 414a of its first plate 41a, that is configured with a tenon 415a, to engage with the bracket 30 while allowing the tenon 415a to inset into a corresponding slot 32 formed on the bracket 30, so that the side panel 40a is connected to the bracket 30. Moreover, there are two locking pieces 416a, 422a disposed respectively at the bottoms of the first plate 41a and the second plate 42a, which are provided for bolting the corresponding side panel 40a to the specific surface 20. Similarly, the other two types of side panels 40b and 40c are configured with flanges 413b, 413c, tenons 415b, 415c and locking pieces 416b, 422b, 416c, 422c in respective so as to be used for coupling to the specific surface 20 and the bracket 30. After coupling the plural side panels 40a, 40b, 40c to the specific surface 20 and the bracket 30, there are spaces being defined between any two neighboring side panels 40a, 40b, 40c that are provided for receiving the fan module composed of the first clamping piece 50, the second clamping piece 60 and the fan 10.

Figure 5:
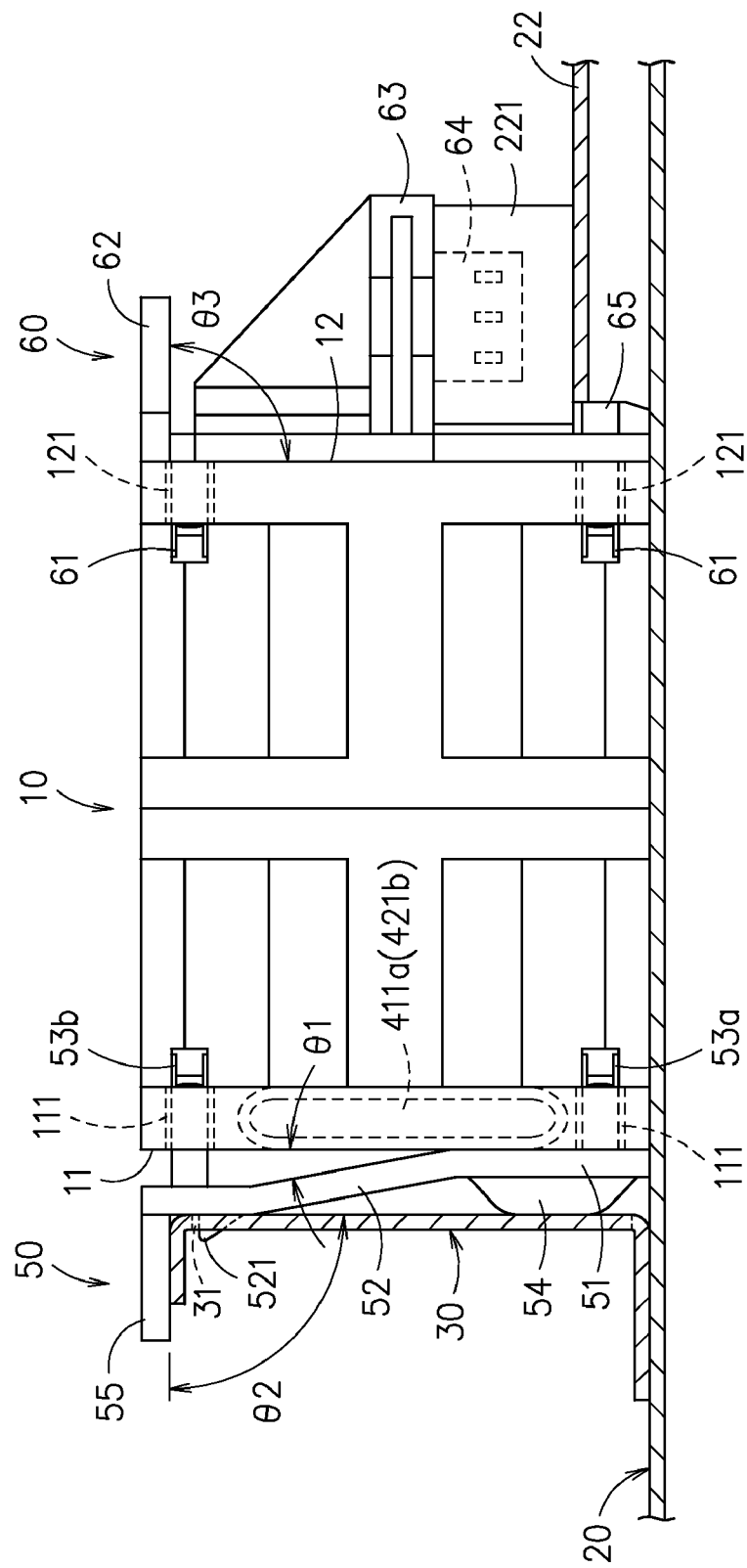
FIG. 5 is a side view of a fan fixing apparatus of the present invention.
Figure 6:
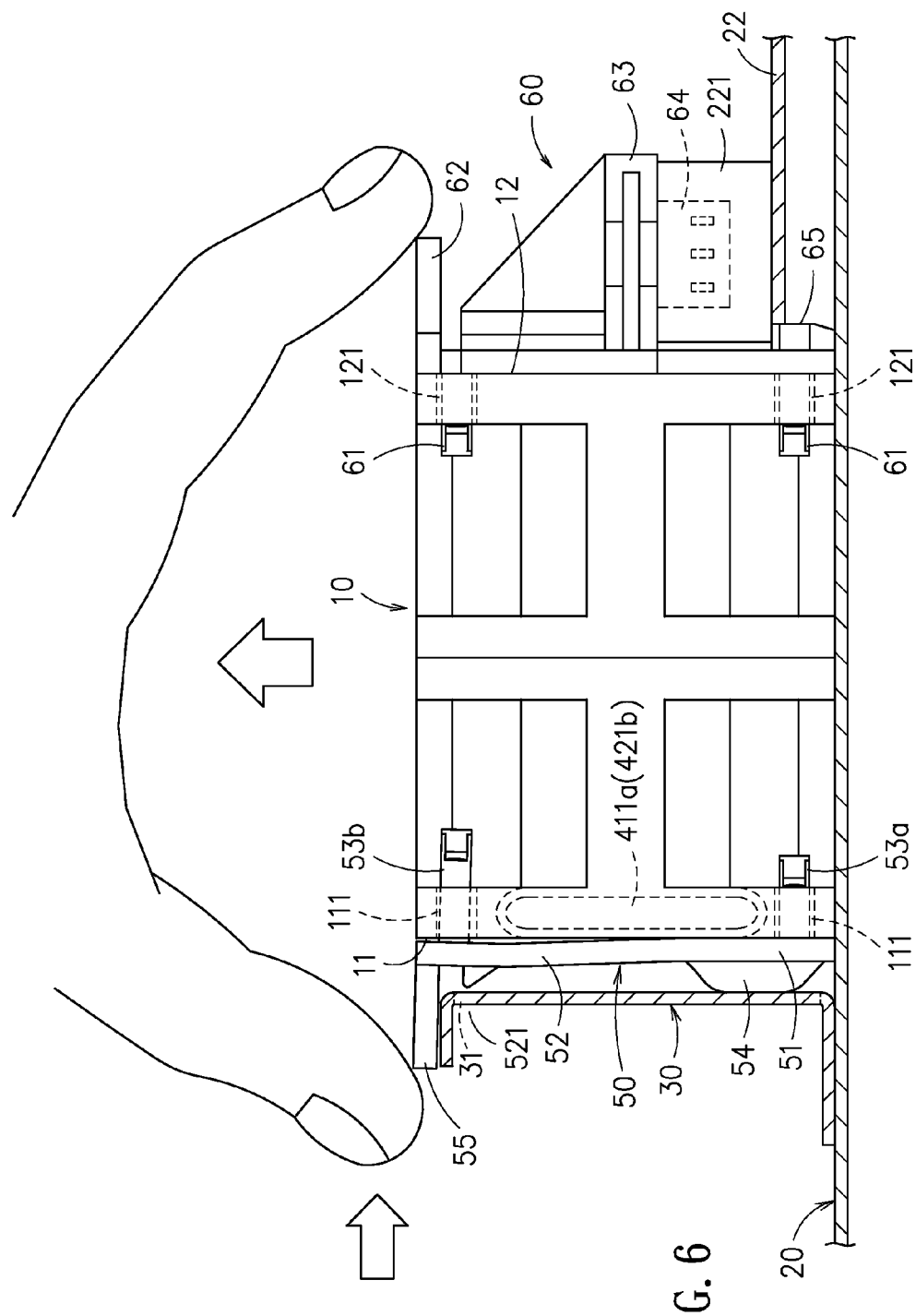
FIG. 6 is a side view of a fan fixing apparatus of the present invention at the same when the first clamping piece is being pressed.
Figure 7:
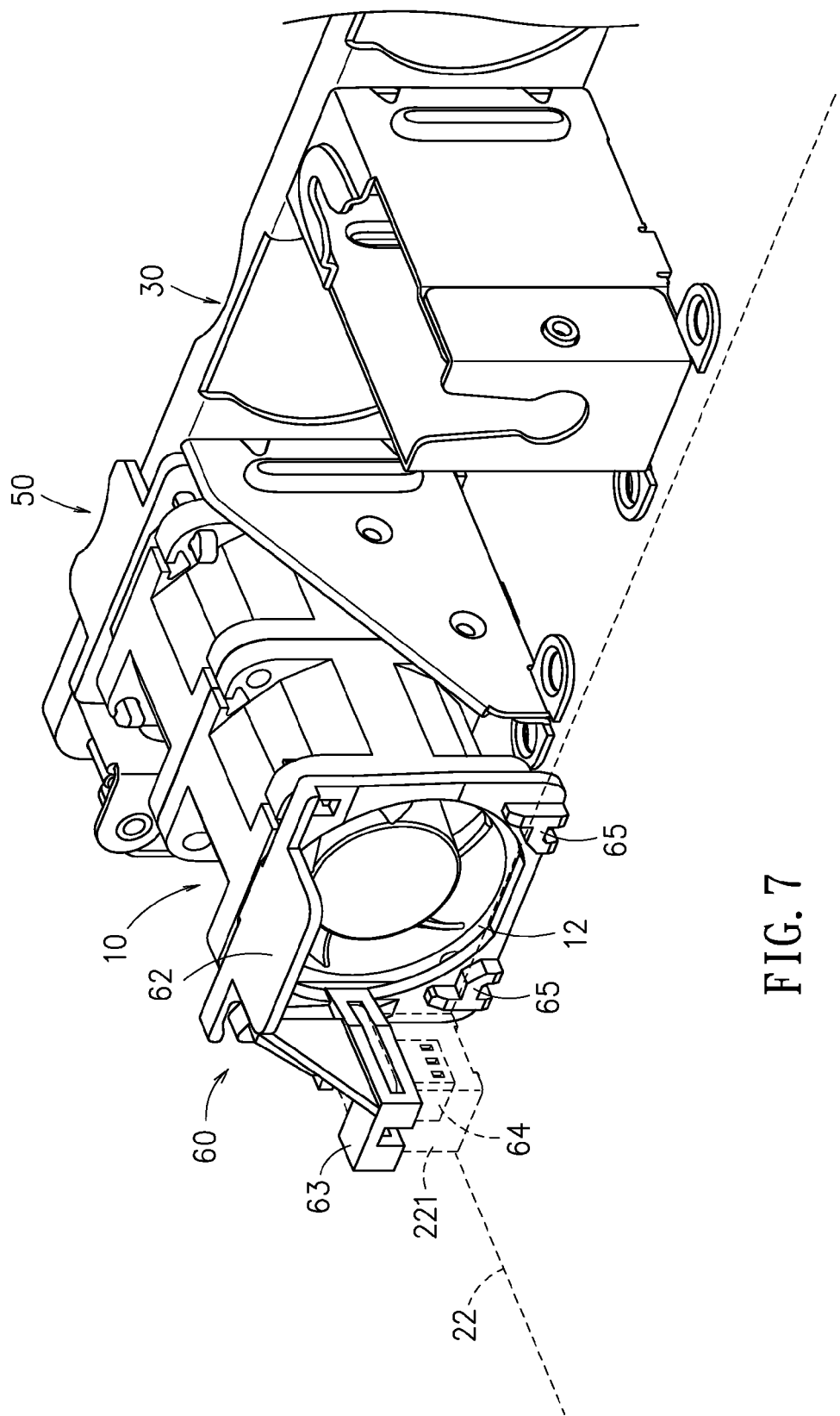
FIG. 7 is a schematic diagram showing a fan fixing apparatus of the present invention that is viewed from a viewing angle different from that of FIG. 1.

As shown in FIG. 4 to FIG. 6, the first clamping piece 50 is mounted to the first end 11 of the fan 10, whereas the first end 11 of the fan 10 is orientated facing toward the bracket 30 for positioning the first clamping piece 50 between the bracket 30 and the first end 11 of the fan 10. In addition, the first clamping piece 50 is composed of a fixing plate 51 and the spring 52, in that the fixing plate 51 is a plate disposed perpendicular to the specific surface 20, and the spring 50 is a bended piece. Moreover, there is a plurality of first holes 111 formed on the first end 11 of the fan 10, and correspondingly, the first clamping piece 50 is formed with a plurality of first hooks 53a on the fixing plate 51, and a plurality of first hooks 53b on the spring 52, at positions corresponding to the plural first holes 111 for allowing the plural first hooks 53a, 53b to engage with the plural first holes 111 so as to connect the first clamping piece 50 to the first end 11 of the fan 10. In order to fixedly secure the fixing plate 51 to the first end 11 of the fan 10 without loosing, each of the first hooks 53a should be designed with a specific length that can allow the same to just barely catch and hook on to their corresponding first holes 111. In addition, since a side of the spring 52, i.e. the bottom of the spring 52, is connected to the top of its corresponding fixing plate 51, there will be an included angle $\theta_1$ formed between the spring 50 and the first end 11 of the fan 10. It is noted that there is no restriction relating to the included angle $\theta_1$ which can be any angle as required, but the first hooks 53b of the spring 52 should be designed with a specific length that can allow the same to just barely catch and hook on to their corresponding first holes 111 while allowing the spring 52 to be spaced from the first end 11 of the fan 10 by a specific distance. As shown in FIG. 5, the fixing plate 51 of the first clamping piece 50 is further configured with a plurality of first bulges 54 at a surface thereof that is not engaged with the fan 10, and at positions sandwiched between the bracket 30 and the first clamping piece 50 while being disposed abutting against the bracket 30. The disposition of the first bulges 54 is for spacing the fan 10 away from the bracket 30 by a specific distance, by that when the spring 52 is being pressed or released, the spring 52 can be enabled to move reciprocatingly between a first position and a second position, and thus, enables the spring 52 to move relative to the first end 11 of the fan 10 in response to the pressing of the spring 52 as well as the releasing of the spring 52 from being pressed. In addition, the spring 52 is formed with at least one first protrusion 521, each being formed protruding out of the spring 52 toward the bracket 30 for allowing the same to inset into the corresponding hollow section 31 of the bracket 30 when the spring 52 is moved and positioned at the first position, as shown in FIG. 5, or detach from the engagement with corresponding hollow section 31 when the spring 52 is moved and positioned at a second position, as shown in FIG. 6. There is a first wing piece 55 mounted to the top of the spring 52 in a manner that the wing piece 50 is protruding out of the surface of the spring 52 while forming an included angle $\theta_2$ of 90 degrees between the wing piece 55 and the spring 52, as shown in FIG. 5. By the arrangement of the wing piece 55, not only the operation for pressing the spring is facilitated, but also the operation for moving the first clamping piece 50 is facilitated since the protruding wing piece 55 provides a good place for users to grasp and pull.

As shown in FIG. 4 to FIG. 7, the second clamping piece 60 is mounted to the second end 12 of the fan 10, whereas there is a plurality of second holes 121 formed on the second end 12 of the fan 10, and correspondingly, the second clamping piece 60 is formed with a plurality of second hooks 61 at positions corresponding to the plural second holes 121 for allowing the plural second hooks 61 to engage with the plural second holes 121 so as to connect the second clamping piece 60 to the second end 12 of the fan 10. Similarly, in order to fixedly secure the second clamping piece 60 to the second end 12 of the fan 10 without loosing, each of the second hooks 61 should be designed with a specific length that can allow the same to just barely catch and hook on to their corresponding second holes 121. In addition, the second clamping piece 60 is further configured with a second wing piece 62 at a surface thereof which in not engaged with the fan 10, while allowing an included angle $\theta_3$ of 90 degrees to be formed between the wing piece 62 and the second clamping piece 60, as shown in FIG. 5. Moreover, the second clamping piece 60 is further configured with a fixing base 63, which is provided for a connector 64 to be disposed thereat as the connector 64 is electrically connected to the fan 10. Similarly, the second clamping piece 60 is further configured with a plurality of second bulges 65 at a surface thereof that is not engaged with the fan 10, and at positions sandwiched between the second clamping piece 60 and a circuitboard 22 disposed on the specific surface 20 while enabling the plural second bulges to be disposed abutting against the edge of the circuitboard 22. As shown in FIG. 5, there is a socket 221 arranged on the circuit board 22 at a position corresponding to the connector 64, so that the connector 64 is able to plug into the socket 221 for connecting electrically the fan 10 to the circuitboard 22.

As shown in FIG. 6, as the fan module is constructed by coupling the first clamping piece 50 and the second clamping piece 60 respectively to the first end 11 and the second end 11 of the fan 10, a user is able to move the fan module simply by grasp onto the first wing piece 55 and the second wing piece 62 for inserting the same into the space sandwiched between the two side panels 40a and 40b of FIG. 2, while enabling the two second protrusions 411a, 421b to abut tightly against the fan 10 for stabilizing the fan 10 and thus preventing the same from wobbling. It is noted that the position and shape of the first bulges 54 as well as those of the first wing piece 55 are not limited by the aforesaid embodiments, and thus can be formed otherwise only if they are disposed on the first clamping piece 50 at a surface thereof that is not engaged with the fan 10, and the disposition of the first bulges 54 is not obstructing the displacement of the spring 52. In addition, the shape and amount of the second bulge are also not limited by the aforesaid embodiments, and thus can be formed otherwise only if they are disposed abutting against the edge of the circuitboard 22 while allowing the second clamping piece 60 to be spaced from the circuitboard 22 by a specific distance. It is noted that by the arrangement of the first bulges 54, the second bulges 65, the connectivity as well as the integrity of the fan module composed of the first clamping piece 50, the second clamping piece 60 and the fan 10 are enhanced as such arrangement can prevent the first clamping piece 50, the second clamping piece 60 and the fan 10 from wobbling. Accordingly, by the arranging the first bulges 54, the second bulges 65, the second protrusions 411a, 421b to abut against to four sides of the fan 10 in respective, the fan 10 is prevented from any lateral displacement, and simultaneously, by insetting the first protrusions 521 into the corresponding hollow sections 31, the fan 10 is prevented from any vertical displacement. In addition, as the connector 64 disposed on the fixing base 63 of the second clamping piece 60 is plugged into the socket 221 of the circuitboard 22, the stability of the fan 10 can be further ensured for preventing the same from any vertical displacement. On the other hand, when it is intended to remove the fan 10, users can simply press the first wing piece 55 for forcing the spring 52 to bend toward the first end 11 of the fan, by that the first protrusion 521 is detached from engaging with the hollow section 31 of the bracket 30, as shown in FIG. 6, and thus the fan 10 along with the first clamping piece 50 can be pulled and removed, and at the same time, by grabbing on to the second wing piece 62 of the second clamping piece 60 for unplugging the connector 64 from the socket 221, the second clamping piece 60 can also be removed along with the pulling of the first clamping piece 50 and the fan 10.

To sum up, the fan fixing apparatus is substantially a frame composed of a bracket and a plurality of side panels that is adapted for receiving a plurality of fan module as each fan module is composed of a fan, a first clamping piece and a second clamping piece, as shown in FIG. 8. Thereby, users are able to place fan modules composed of a fan 10, a first clamping piece 50 and a second clamping piece 60 at different locations on the bracket at will as required. Since there is no rear baffle used in the present invention as it is required in prior arts, the present invention provides a low-cost fan fixing apparatus with simple structure and high space utilization that is adapted for facilitating a fan module to be plugged-in or removed rapidly.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A fan fixing apparatus, adapted for mounting a fan formed with a first end and a second end that are opposite to each other on a specific surface, comprising:
   a bracket, perpendicularly disposed on the specific surface, formed with at least one hollow section at position allowing the section to the first end of the fan while the first end of the fan is positioned facing toward the bracket;
   a plurality of side panels, perpendicularly disposed on the specific surface as an array, while enabling each side panel to be disposed perpendicular to the bracket as one side of each side panel is connected to the bracket for allowing the fan to be received between any two neighboring side panels;
   a first clamping piece, arranged at the first end of the fan, configured with a spring while enabling the first clamping piece to move reciprocatingly between a first position and a second position by the resilience thereof; and
   a second clamping piece arranged at the second end of the fan;
   wherein, the spring is formed with at least one first protrusion, each being formed protruding out of the spring toward the bracket for allowing the first protrusion to inset into the corresponding hollow section of the bracket when the spring is moved and positioned at the first position, and detach from the engagement with corresponding hollow section when the spring is moved and positioned at a second position.

2. The fan fixing apparatus of claim 1, wherein the surface of each side panel that is orientated facing toward the fan is configured with at least one second protrusion for allowing fan to be sandwiched between the two second protrusions of any two neighboring side panels.

3. The fan fixing apparatus of claim 2, wherein each second protrusion is shaped as a bar extending in a longitudinal direction perpendicular to the specific surface.

4. The fan fixing apparatus of claim 2, wherein each of the plural side panels is composed a first plate and a second plate, both having the at least one second protrusion formed respectively on surfaces thereof while allowing the surfaces thereof where there is no second protrusion to be orientated facing toward each other.

5. The fan fixing apparatus of claim 1, wherein the first clamping piece is composed of a fixing plate and the spring in a manner that the fixing plate is connected to the first end of the fan while enabling a side of the spring to be connected to the fixing plate so as to form an included angle between the spring and the first end of the fan and thus, enabling the spring to move relative to the first end of the fan in response to the pressing of the spring as well as the releasing of the spring from being pressed.

6. The fan fixing apparatus of claim 1, wherein there is a plurality of first holes formed on the first end of the fan, and correspondingly, the first clamping piece is formed with a plurality of first hooks at positions corresponding to the plural first holes for allowing the plural first hooks to engage with the plural first holes so as to connect the first clamping piece to the first end of the fan.

7. The fan fixing apparatus of claim 1, wherein there is a plurality of second holes formed on the second end of the fan, and correspondingly, the second clamping piece is formed with a plurality of second hooks at positions corresponding to the plural second holes for allowing the plural second hooks to engage with the plural second holes so as to connect the second clamping piece to the second end of the fan.

8. The fan fixing apparatus of claim 1, wherein the second clamping piece is further configured with a fixing base, provided for a connector to be disposed thereat as the connector is electrically connected to the fan.

9. The fan fixing apparatus of claim 1, wherein the first clamping piece is further configured with a plurality of first bulges at a surface thereof that is not engaged with the fan, and at positions sandwiched between the bracket and the first clamping piece while being disposed abutting against the bracket.

10. The fan fixing apparatus of claim 1, wherein the second clamping piece is further configured with a plurality of second bulges at a surface thereof that is not engaged with the fan, and at positions sandwiched between the second clamping piece and a circuitboard disposed on the specific surface while being disposed abutting against the edge of the circuitboard.

* * * * *